United States Patent
Yang et al.

(10) Patent No.: US 8,237,168 B2
(45) Date of Patent: Aug. 7, 2012

(54) ORGANIC LIGHT EMITTING DISPLAY DEVICE

(75) Inventors: Hui-Won Yang, Yongin (KR);
Yeon-Gon Mo, Yongin (KR); Jin-Seong Park, Yongin (KR); Min-Kyu Kim, Yongin (KR); Tae-Kyung Ahn, Yongin (KR); Hyun-Joong Chung, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 251 days.

(21) Appl. No.: 12/801,201

(22) Filed: May 27, 2010

(65) Prior Publication Data
US 2011/0042666 A1 Feb. 24, 2011

(30) Foreign Application Priority Data

Aug. 21, 2009 (KR) .................. 10-2009-0077485

(51) Int. Cl.
*H01L 51/00* (2006.01)
*H01L 35/24* (2006.01)
*H01L 29/04* (2006.01)
*H01L 31/036* (2006.01)

(52) U.S. Cl. ............... 257/72; 257/40; 257/43
(58) Field of Classification Search .......... 257/40, 257/43, 59–63, 72, E29.273, E39.007, E51.006, 257/E51.007
See application file for complete search history.

(56) References Cited

U.S. PATENT DOCUMENTS

| 8,026,511 B2* | 9/2011 | Choi et al. | 257/40 |
| 2005/0264190 A1* | 12/2005 | Park et al. | 313/506 |

FOREIGN PATENT DOCUMENTS

| JP | 2004-273614 A | 9/2004 |
| KR | 10 2004-0038839 A | 5/2004 |
| KR | 10-2007-0069387 A | 7/2007 |
| KR | 10-2008-0058036 A | 6/2008 |
| KR | 10 2009-0065951 A | 6/2009 |

OTHER PUBLICATIONS

Korean Office Action in KR 10-2009-0077485, dated Aug. 30, 2011 (Yang, et al.).

* cited by examiner

*Primary Examiner* — Cuong Q Nguyen
(74) *Attorney, Agent, or Firm* — Lee & Morse, P.C.

(57) ABSTRACT

An organic light emitting display device including a plurality of scan lines arranged in a first direction, a plurality of data lines arranged in a second direction, the plurality of data lines intersecting with the plurality of scan lines, and pixels respectively disposed at intersection portions of the scan and data lines, each pixel including at least one thin film transistor (TFT) and an organic light emitting diode, wherein the TFT is an oxide TFT, the oxide TFT including a first oxide semiconductor layer as an active layer, and a second oxide semiconductor layer is disposed between intersecting scan and data lines.

11 Claims, 2 Drawing Sheets

ORGANIC LIGHT EMITTING DISPLAY DEVICE

BACKGROUND

1. Field

Embodiments relate to an organic light emitting display device.

2. Description of the Related Art

An organic light emitting display device is a next-generation self-luminescent display device exhibiting improved viewing angle, contrast, response speed, and power consumption, when compared to a liquid crystal display (LCD).

An organic light emitting display device may include an organic light emitting diode (OLED). The OLED may include an anode, an organic thin film layer, and a cathode. The organic light emitting display device may be classified into a passive matrix type and an active matrix type. In the passive matrix type, pixels may be configured by connecting OLEDs in a matrix form between scan and data lines. In the active matrix type, operation of each of the pixels may be controlled by a thin film transistor (TFT) serving as a switch.

In a process of manufacturing an array substrate in the active matrix type organic light emitting display device, the scan line may be formed of the same material as, and in the same layer as, a gate electrode of the TFT. The data line may be formed of the same material as, and in the same layer as, a source/drain electrode of the TFT. In this case, a plurality of TFTs may be connected to one scan line. Thus, as the resolution of a panel is increased, the number of TFTs connected to each of the scan lines may also increase. Therefore, if a length of the scan line is increased because the size of the panel is increased, undesirable resistive-capacitive (RC) delay in scan signals applied to the scan line may also be increased.

An increase of parasitic capacitance generated at a region where the scan and data lines overlap may also result in an increase of the RC delay described above. Such an RC delay may cause on-off reaction time of TFTs to be delayed. Accordingly, a signal may be supplied to a next scan line before each of the pixels connected to the scan and data lines is completely charged/discharged. Thus, image quality of the panel may be degraded. Therefore, minimizing resistance of wire electrodes as well as the parasitic capacitance between wires may be desirable.

SUMMARY

Embodiments are directed to an organic light emitting display device, which substantially overcomes one or more of the problems due to the limitations and disadvantages of the related art.

It is a feature of an embodiment to provide an organic light emitting display device with reduced parasitic capacitance in overlapping portions of scan and data lines.

It is another feature of an embodiment to provide an organic light emitting display device with improved image quality.

At least one of the above and other features and advantages may be realized by providing an organic light emitting display device including a plurality of scan lines arranged in a first direction, a plurality of data lines arranged in a second direction, the plurality of data lines intersecting with the plurality of scan lines, and pixels respectively disposed at intersection portions of the scan and data lines, each pixel including at least one thin film transistor (TFT) and an organic light emitting diode, wherein the TFT is an oxide TFT, the oxide TFT including a first oxide semiconductor layer as an active layer, and a second oxide semiconductor layer is disposed between intersecting scan and data lines.

The second oxide semiconductor layer may be disposed entirely within a region defined by the intersecting scan and data lines.

The oxide TFT may have an inverted staggered bottom gate structure.

The oxide TFT may include a gate electrode and a gate insulating layer on the gate electrode, the first oxide semiconductor layer on the gate insulating layer and overlying the gate electrode, and source and drain electrodes electrically connected to the first oxide semiconductor layer.

The second oxide semiconductor layer may be on the gate insulating layer and spaced apart from the first oxide semiconductor layer.

The first and second oxide semiconductor layers may include at least one of zinc (Zn), gallium (Ga), indium (In), hafnium (Hf), and tin (Sn).

The first and second oxide semiconductor layers may include ZnO.

The gate insulating layer, the second oxide semiconductor layers, and a protective layer may be sequentially laminated between intersecting scan and data lines.

The organic light emitting diode may include a first electrode coupled to one of the source or drain electrode of the TFT, an organic thin film layer on the first electrode, and a second electrode on the organic thin film layer.

The first oxide semiconductor layer may have substantially the same thickness as the second oxide semiconductor layer.

The first oxide semiconductor layer may include substantially the same material as the second oxide semiconductor layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
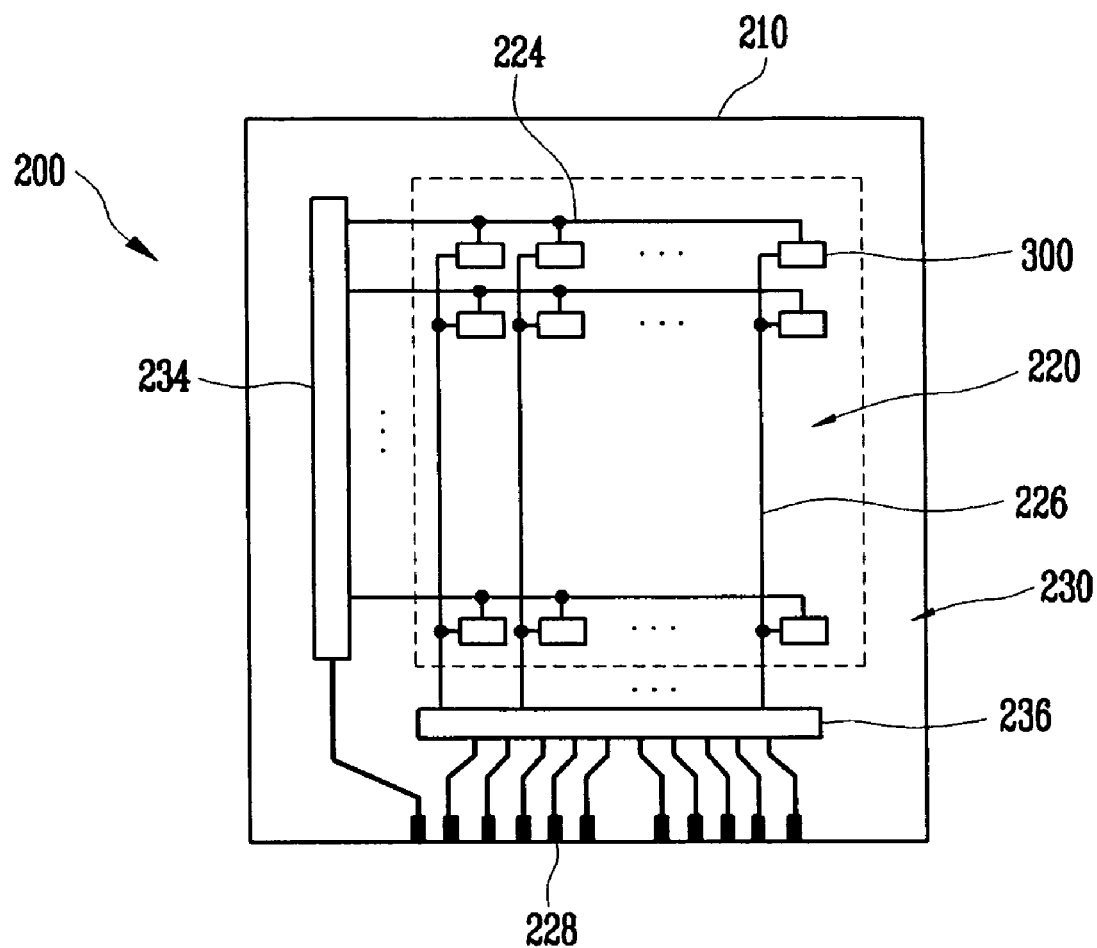
FIGS. 1A and 1B respectively illustrate plan and sectional views of an organic light emitting display device according to an embodiment.

Korean Patent Application No. 10-2009-0077485, filed on Aug. 21, 2009, in the Korean Intellectual Property Office, and entitled: "Organic Light Emitting Display Device" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. Also, when an element is referred to as being "connected to" another element, it can be directly connected to the another element or be indirectly connected to the another element with one or more intervening elements interposed therebetween. Hereinafter, like reference numerals refer to like elements.

Figure 1B:
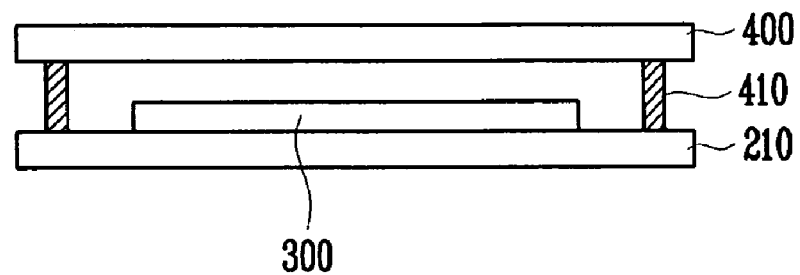

FIGS. 1A and 1B respectively illustrate plan and sectional views of an organic light emitting display device according to an embodiment. Referring to FIG. 1A, a substrate 210 may include a pixel area 220 and a non-pixel area 230 surrounding the pixel area 220. A plurality of pixels 300 connected in a matrix form between scan and data lines 224 and 226 may be disposed on the substrate 210 in the pixel area 220. The non-pixel area 230 may include scan and data lines 224 and 226 respectively extending from the scan and data lines 224 and 226 in the pixel area, power supply lines (not shown) for operations of the pixels 300, and scan and data drivers 234 and 236 for processing signals supplied from the exterior through pads 228 to supply the processed signals to the scan and data lines 224 and 226. Each pixel 300 may include a pixel circuit having at least one thin film transistor (TFT) and an OLED connected to the pixel circuit. The TFT of the pixels 300 may be an oxide TFT using, e.g., an oxide semiconductor layer (not shown), as an active layer.

Referring to FIG. 1B, a sealing substrate 400 for sealing the pixel area 220 may be disposed above the substrate 210 having the pixel 300 thereon. The sealing substrate 400 may be coupled to the substrate 210 by a sealing member 410, thereby completing a display panel 200.

The scan lines 224 may be arranged in a first direction and the data lines 226 may be arranged in a second direction. In an implementation, the first direction may cross the second direction. An oxide semiconductor layer (not shown) may be formed between overlapping scan and data lines 224 and 226, reducing parasitic capacitance generated therebetween. A detailed configuration thereof will be described below with reference to FIG. 2.

Figure 2:
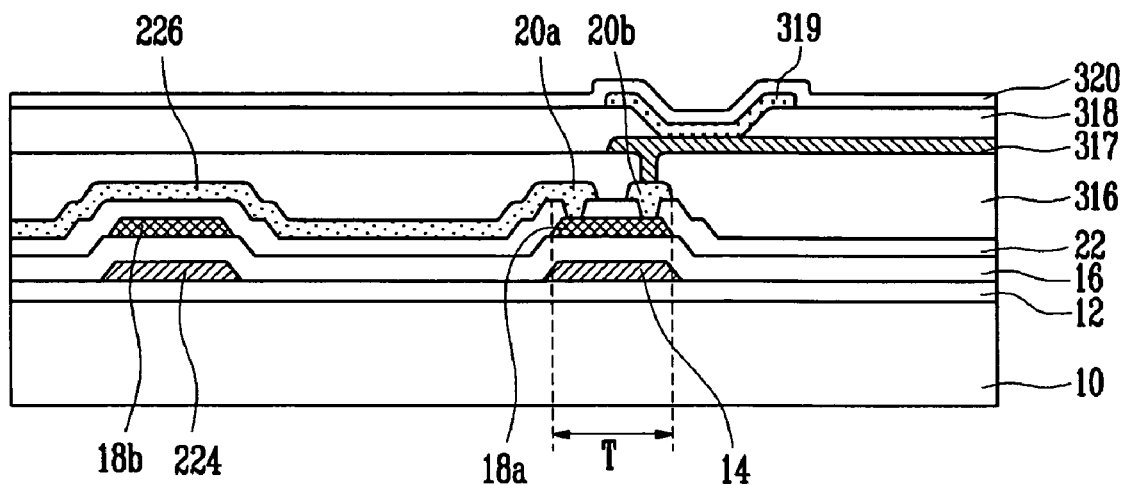
FIG. 2 illustrates a sectional view of a pixel and scan and data lines of FIG. 1.
Figure 3:
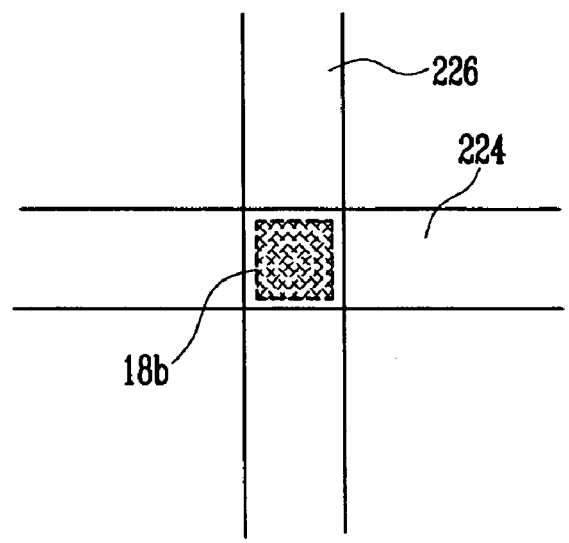
FIG. 3 illustrates a plan view of the scan and data lines of in FIG. 2.

FIG. 2 illustrates a sectional view of a pixel and scan and data lines of FIG. 1. FIG. 3 illustrates a plan view of the scan and data lines of FIG. 2.

Referring to FIG. 2, a TFT (T) and an OLED connected to the TFT may be formed in a portion of the pixel. In particular, a buffer layer 12 may be formed on a substrate 10. A gate electrode 14 of the TFT and a scan line 224 for supplying a scan signal to the gate electrode 14 may be formed on, e.g., directly on, the buffer layer 12. The gate electrode 14 may be formed in the pixel area 220.

The gate electrode 14 of the TFT may be formed at a position where the gate electrode 14 will overlap with a later-formed first oxide semiconductor layer 18a. Thus, the TFT may be an oxide TFT having an inverted staggered bottom gate structure.

A gate insulating layer 16 may be formed on the substrate 10 having the gate electrode 14. The first oxide semiconductor layer 18a providing, e.g., channel, source, and drain regions, may be formed on, e.g., directly on, the gate insulating layer 16 at a position where the gate insulating layer 16 overlies the gate electrode 14 of the TFT. For example, the gate electrode 14, the gate insulating layer 16, and the first oxide semiconductor layer 18a may be sequentially formed on the buffer layer 12.

The gate insulating layer 16 and a second oxide semiconductor layer 18b may also be formed in a region overlying the scan line 224. For example, the second oxide semiconductor layer 18b may have a thickness substantially the same as a thickness of the first oxide semiconductor layer 18a and/or the second oxide semiconductor layer 18b may be made of substantially the same material as the first oxide semiconductor layer 18a. For example, the first and second oxide semiconductor layers 18a and 18b may be formed simultaneously on the gate insulating layer to a substantially same thickness. In addition, for example, each of the oxide semiconductor layers 18a and 18b may overlap, e.g., completely overlap, each of a respective gate electrode 14 and scan line 224.

The second oxide semiconductor layer 18b may be formed in a region between overlapping scan and data lines 224 and 226, as illustrated in FIG. 3. Thus, a distance between the scan and data lines 224 and 226 may be increased, beneficially reducing parasitic capacitance generated at the overlapping portion of the scan and data lines 224 and 226. Due to the reduction in parasitic capacitance, it is possible to prevent degradation of the image quality of the panel. In an implementation, the first and second oxide semiconductor layers 18a and 18b may be formed at the same time.

In contrast, when a conventional gate insulating layer is formed on the entire surface of the substrate including on the scan line, i.e., having only the active layer in a region overlying the gate electrode without a second active layer, a distance between the scan line and data line may be small and parasitic capacitance may be generated.

The first and second oxide semiconductor layers 18a and 18b may each include, e.g., zinc (Zn), gallium (Ga), indium (In), hafnium (Hf), and/or tin (Sn). In an implementation, the oxide semiconductor material may include, e.g., ZnO, may exhibit both amorphous and stable properties, and may be fabricated at a low temperature of, e.g., about 350 ° C. or less, using existing processing equipment.

A protective layer 22 may be formed on the first oxide semiconductor layer 18a. Via holes may be formed in predetermined regions (regions respectively corresponding to source or drain regions) of the protective layer 22. Source and drain electrodes 20a and 20b may be formed on the protective layer 22 in contact with source and drain regions of the oxide semiconductor layer 18a, respectively.

The protective layer 22 may also be formed on the second oxide semiconductor layer 18b in the region of the scan line 224. The data line 226 may be disposed on the protective layer 22. The data line 226 may include the same material as that of the source and drain electrodes 20a and 20b.

As illustrated in FIG. 3, the data line 226 may be formed along a direction intersecting a direction of the scan line 224. Thus, the second oxide semiconductor layers 18b may be disposed between the intersecting scan and data lines 224 and 226. In an implementation, the second oxide semiconductor layer 18b may be disposed entirely within a region defined by intersecting scan and data lines 224 and 226.

A planarization layer 316 for surface planarization may be formed on the protective layer 22. The planarization layer 316 may have a via hole formed therein to expose the source or drain electrode 20a or 20b of the TFT. A first electrode 317 of the organic light emitting device may be connected to the source or drain electrode 20a and 20b through the via hole.

A pixel defining layer 318 may be formed on the planarization layer 316 such that a light emitting region of the first electrode 317 is exposed. An organic thin film layer 319 may be formed on the first electrode 317. A second electrode 320 may be formed on the pixel defining layer 318 having the organic thin film layer 319.

Each of the TFTs used in the active matrix display may include an active layer for providing channel, source, and drain regions, and a gate electrode associated with the channel region and electrically insulated from the active layer by a gate insulating layer. The active layer of the TFT may be formed of a semiconductor material, e.g., amorphous silicon, polysilicon, low temperature polysilicon, or an oxide semiconductor layer.

Forming the active layer from the oxide semiconductor may help ensure that mobility is sufficiently high and it is possible to realize a driving circuit operating at a high speed, unlike in an amorphous silicon active layer. Furthermore, forming the active layer from the oxide semiconductor may help ensure that a threshold voltage of the TFT is not unstable, unlike in a polysilicon active layer, due to the polycrystalline nature of the polysilicon. Thus, a complicated, yield-lowering, compensating circuit may not be required to compensate for the threshold voltage and distribution of the mobility. In addition, the number of masks needed for fabrication may remain low. Therefore, fabrication costs may be reduced accordingly. Forming the active layer from an oxide semiconductor may also help ensure that a high-priced process, e.g., laser heat treatment, is not needed, and it may be easy to control characteristics, ensuring applicability to a large-area substrate, in contrast to a low temperature polysilicon (LTPS) active layer. In addition, an ion implanting process may be omitted.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
a plurality of scan lines arranged in a first direction;
a plurality of data lines arranged in a second direction, the plurality of data lines intersecting with the plurality of scan lines; and
pixels respectively disposed at intersection portions of the scan and data lines, each pixel including at least one thin film transistor (TFT) and an organic light emitting diode, wherein:
the TFT is an oxide TFT, the oxide TFT including a first oxide semiconductor layer as an active layer, and
a second oxide semiconductor layer is disposed between intersecting scan and data lines.

2. The organic light emitting display device as claimed in claim 1, wherein the second oxide semiconductor layer is disposed entirely within a region defined by the intersecting scan and data lines.

3. The organic light emitting display device as claimed in claim 1, wherein the oxide TFT has an inverted staggered bottom gate structure.

4. The organic light emitting display device as claimed in claim 3, wherein the oxide TFT includes:
a gate electrode and a gate insulating layer on the gate electrode,
the first oxide semiconductor layer on the gate insulating layer and overlying the gate electrode, and
source and drain electrodes electrically connected to the first oxide semiconductor layer.

5. The organic light emitting display device as claimed in claim 4, wherein the second oxide semiconductor layer is on the gate insulating layer and spaced apart from the first oxide semiconductor layer.

6. The organic light emitting display device as claimed in claim 1, wherein the first and second oxide semiconductor layers include at least one of zinc (Zn), gallium (Ga), indium (In), hafnium (Hf), and tin (Sn).

7. The organic light emitting display device as claimed in claim 6, wherein the first and second oxide semiconductor layers include ZnO.

8. The organic light emitting display device as claimed in claim 1, wherein the gate insulating layer, the second oxide semiconductor layers, and a protective layer are sequentially laminated between intersecting scan and data lines.

9. The organic light emitting display device as claimed in claim 1, wherein the organic light emitting diode includes:
a first electrode coupled to one of the source or drain electrode of the TFT,
an organic thin film layer on the first electrode, and
a second electrode on the organic thin film layer.

10. The organic light emitting display device as claimed in claim 1, wherein the first oxide semiconductor layer has substantially the same thickness as the second oxide semiconductor layer.

11. The organic light emitting display device as claimed in claim 1, wherein the first oxide semiconductor layer includes substantially the same material as the second oxide semiconductor layer.

* * * * *